United States Patent

Barna et al.

[11] Patent Number: 4,859,277
[45] Date of Patent: Aug. 22, 1989

[54] METHOD FOR MEASURING PLASMA PROPERTIES IN SEMICONDUCTOR PROCESSING

[75] Inventors: Gabriel G. Barna, Richardson; Demetre J. Economou, Houston, both of Tex.

[73] Assignee: Texas Instruments Incorporated, Dallas, Tex.

[21] Appl. No.: 189,572

[22] Filed: May 3, 1988

[51] Int. Cl.[4] .................. B44C 1/22; B05D 3/06; H01L 21/306; C03C 15/00
[52] U.S. Cl. .................. 156/626; 118/50.1; 118/620; 118/712; 156/643; 156/646; 156/345; 204/192.13; 204/192.33; 204/298; 427/8; 427/38
[58] Field of Search ............... 156/626, 643, 646, 345; 204/192.33, 192.13, 298; 356/437; 427/8, 38, 39; 118/50.1, 620, 712, 728

[56] References Cited

U.S. PATENT DOCUMENTS

| | | | |
|---|---|---|---|
| 4,491,499 | 1/1985 | Derde et al. | 156/626 |
| 4,493,745 | 1/1985 | Chen et al. | 156/626 |
| 4,609,426 | 9/1986 | Ogawa et al. | 156/626 |
| 4,675,072 | 6/1987 | Bennett et al. | 156/626 |
| 4,710,261 | 12/1987 | Dennis | 156/626 |

OTHER PUBLICATIONS

Khoury, "Real-Time Etch Plasma Monitor System", IBM Tech. Discl. Bulletin, vol. 25, No. 11A, Apr. 1983, pp. 5721-5723.

Primary Examiner—William A. Powell
Attorney, Agent, or Firm—Joseph E. Rogers; James T. Comfort; Melvin Sharp

[57] ABSTRACT

An apparatus and method for measuring the concentration profile of an active species across the surface of a semiconductor slice in a plasma reactor is disclosed that permits uniformity of etch and deposition across the surface of the semiconductor slice.

32 Claims, 4 Drawing Sheets

METHOD FOR MEASURING PLASMA PROPERTIES IN SEMICONDUCTOR PROCESSING

FIELD OF THE INVENTION

This invention relates to semiconductor processing, and more particularly to a technique for measuring plasma properties such as the concentration profile of the active species across the surface of a semiconductor slice during processing, including plasma etch and deposition procedures.

BACKGROUND OF THE INVENTION

One of the problems in plasma etching and deposition is the uniformity of the etch or deposition across the surface of the slice. While it is generally understood that the fundamental plasma properties, such as reactant concentrations, ion density/energy profiles, and plasma sheath potentials, control the dependent variables such as rate, uniformity and anisotropy of a process, these properties are typically not monitored in a commercial plasma reactor. The usual approach to controlling these dependent variables is to monitor and control the independent variables such as gas flows and pressures. They are then correlated to the dependent variables via intuition or some empirical model. While these approaches have been effective, the control of plasma processes would be enhanced by a knowledge of the fundamental plasma properties.

Basically, the only typical plasma characterization tool available on all plasma reactors is an endpoint detection system. This is a spectroscopic tool that looks at the intensity of the plasma at a single wavelength that corresponds to the emission of a reactant or product species in the process. A change in the intensity of this signal indicates a change in the concentration of the specific species, and hence indicates the completion of an etch process. However, this method provides no indication of etching uniformly nor of any of the fundamental plasma properties.

BRIEF DESCRIPTION OF THE INVENTION

The invention defines a new measurement technique which is incorporated into a plasma reactor. The invention measures, and allows control of the concentration profile of the active species across the surface of a semiconductor slice being processed in the plasma reactor. This parameter is only one of many that control the uniformity of the reaction involved. The ability to measure this parameter independently enhances the uniformity of plasma reactions.

The method involves the measurement of the intensity of the emission of a cylinder of light from the plasma, parallel to the surface of the slice. This is done with an optical train. The plasma is observed through one of more diaphragms, an optical filter, and a focus lens that directs the light into an optical fiber input to a monochrometer.

Alternatively, when using a second gas such as argon as an actinometric gas, the monochrometer could be replaced with by a beam-splitter and two photodiodes with filters corresponding to the emissions lines of $Ar^*$ and $X^*$. By translation of this train in the horizontal plane, the intensity of the specific emission line is profiled across the surface of the semiconductor slice. Using actinometry, the mixing of a small percent of Ar into the plasma, which measures the intensity of the $X^*$ species vs. the $Ar^*$, and the appropriate mathematical transformation (Abel transform), the concentration profile of $X^*$ is determined across the surface of the slice.

Using the method and apparatus of the invention, the concentration profile of the species $X^*$ can be monitored and adjusted through control of independent parameters such as pressure and flow. Other parameters such as reactivity of the hardware components peripheral to the slice and the plasma can also affect the concentration profile.

DESCRIPTION OF A PREFERRED EMBODIMENT OF THE INVENTION

Figure 1:
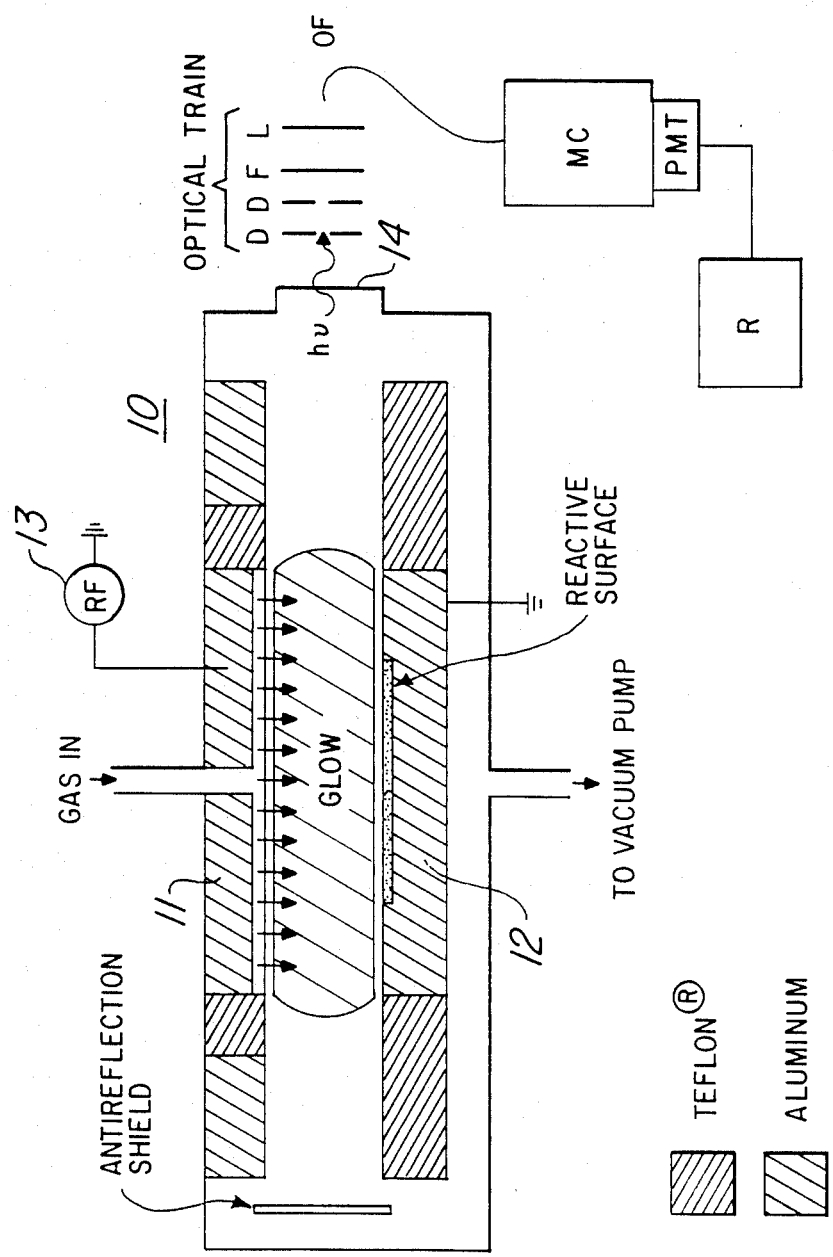
FIG. 1 illustrates a Parallel Plate plasma reactor used in the invention.

FIG. 1 illustrates a parallel plate plasma reactor 10 used in the present invention. The parallel plate single-wafer etcher has, for example, a 13.1 cm diameter, hard-anodized aluminum powered shower head upper electrode 11 held at a distance of approximately 2.2 cm from the 13.9 cm, diameter aluminum grounded lower electrode 12.

The temperature of both electrodes is controlled with a closed-loop system, and the lower electrode temperature is monitored with an embedded Fe-Constantan thermocouple. Gases are pumped into the reactor by a two stage rotary vane pump, and the base pressure is maintained at less than 1 mTorr. The chamber pressure and gas flow rate are independently controlled by a closed loop system composed of a pressure transducer, an exhaust throttle valve, and a controller. The gas flow rate is regulated by mass flow controllers. Extra dry oxygen and argon (as actinometer) are used in the system. Power to the upper electrode 13 is at a frequency of 13.56 MHz. An automatic matching network is used to minimize the reflected power to less than 1 % of the forward power. Both forward and reflected power are monitored by a direction wattmeter. Light from the plasma emission is collected through a quartz window 14 through a pair of iris diaphragms D to attain spatial resolution. The light hv from the plasma is focused onto one end of an optical fiber OF and is transmitted to the entrance slit of a monochrometer MC having a 1200 groves/mm diffraction grating. The light is passed through the exit slit and is detected by a photomultiplier tube PMT driven by a photometer. A long pass filter F (>495 nm) is used to avoid second-order interference in the light emission spectrum.

The following is an analysis of an oxygen plasma system and is not intended to limit the method of the invention to a single system, but is used only by way of example. The purpose of the following system is to illustrate an active species concentration profile and to show the dependence on plasma operation conditions. Oxygen plasma is used in the system because the glow discharge reactions are better known as compared to other systems. A silver oxide (Ag$_2$O) film is used as the reactive substrate. The film is prepared by coating part of the lower electrode with a silver paint. When the coating is exposed to an oxygen plasma, the organic binder is burned and the remaining silver is turned into black silver oxide. Silver oxide is known to be catalytic towards surface recombination of atomic oxygen, the main etchant species in an oxygen plasma. The silver oxide/oxygen plasma system is believed to simulate etching of a thin film. Using a silver oxide film instead of etchable material (e.g. polymer in the case of oxygen plasma) has several advantages. First, the coupling of the plasma to ground is nearly uniform as compared to possible non-uniformities of plasma coupling through a silicon wafer resting on the electrode. Secondly, contamination of the plasma by reaction products is absent.

The surface reaction on the silver oxide is simply the recombination of atomic oxygen to yield molecular oxygen. Thus, the discharge is regarded as one in pure oxygen. Hence, data for pure oxygen plasma is used for calculations, and any reactant concentration gradient is due to differences in reactivity between the Ag$_2$O film and the surrounding electrode surface.

Optical emission spectroscopy (OES) with an actinometer gas is employed to obtain the reactant concentration profiles. In OES, the intensity of light emitted by a species may be related to the ground state concentration of that species. The pertinent reaction may be written as $$O + e \xrightarrow{k_e} O^* \quad (R1)$$

$$O^* \xrightarrow{k_s} O + h\nu \quad (R2)$$

$$O^* + M \xrightarrow{k_q} O + M \quad (R3)$$

Reaction (R1) is the excitation of species O by electron impact. The excited species O* can decay by spontaneous emission (R2) or by quenching upon collision with other species (R3).

If reaction (R3) can be neglected, the spontaneous emission intensity is proportional to the ground state concentration [O].

$$i_o \sim k_e n_e [O] \quad (1)$$

The above analysis assumes electron-impact excitation as the dominant mechanism for producing O*. For example, a reaction of the type $$O_2 + e \rightarrow O^* + O \quad (R4)$$

would invalidate actinometry if the corresponding O*-atom were to emit at the wavelength of interest. However, in equation (1), the so called excitation efficiency $\eta_e = k_e n_e$ depends on the reactor operating conditions. In order to account for this variation, a small amount of inert gas (the actinometer) is used which has an excitation threshold and a cross section similar to the species of interest. This way, although the individual $\eta_e$ values for the actinometer and the species of interest change with operating conditions, their ratio remains almost constant. Hence by writing an equation similar to equation (1) for the actinometer gas (for example Ar), and taking their ratio results $$\frac{i_o}{i_{Ar}} = \frac{q[O]}{[Ar]} \quad (2)$$

where q is a proportionality constant and [Ar] is the known concentration of the actinometer. By measuring $i_o$ and $i_{Ar}$ at the appropriate wavelengths, the relative change in [O] can be obtained. In the measurements of the present example, a 8446 angstroms O-atom line and a 7540 angstroms Ar line were used. A 5% mole fraction of the actinometer gas was used.

Figure 2:
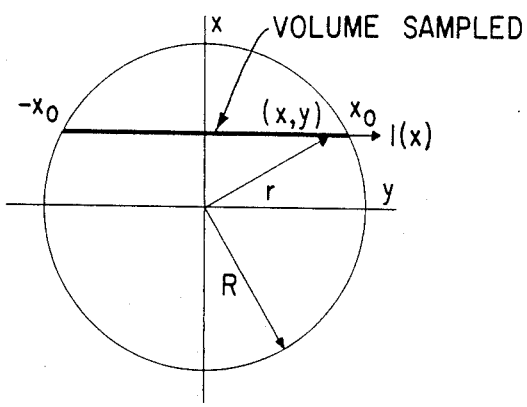
FIG. 2 is a cross section of the radially symmetric glow take at a selected parallel plane.

FIG. 2 shows a cross section of the radially symmetric glow taken at a certain plane parallel to the electrodes (for example $z = z_o$). The optical train collects light from a small cylindrical volume, as shown in the Figure. By translating the optics parallel to the x-axis, light from different locations is collected and intensity $I(x, a_o)$ measured. The latter may be related to the local emission intensity $i(r, z_o)$ as $$I(x, z_o) = \int_x^R \frac{r\Omega(x,r)}{\sqrt{r^2 - x^2}} i(r, z_o) dr \quad (3)$$

where $$\Omega(x,r) = \exp\{-\alpha(\sqrt{1 - x^2} - \sqrt{r^2 - x^2})\} + \exp\{-\alpha(\sqrt{1 - x^2} + \sqrt{r^2 - x^2})\} \quad (4)$$

Equation (3) accounts for radiation trapping with a constant absorption coefficients, $\alpha$. for sufficiently small $\alpha$, equation (3) reduces to $$I(x, z_o) = \int_x^R \frac{r i(r, z_o) dr}{\sqrt{r^2 - x^2}} \quad (5)$$

The last integral is inverted by applying an Abel transform to yield $$i(r, z_o) = -\frac{1}{\pi} \int_r^R \frac{I'(x, z_o) dx}{\sqrt{x^2 - r^2}} \quad (6)$$

where $I'(x, z_o) = dI(x, z_o)/dx$. Equation (6) is numerically integrated using the measured values of $I(x, z_o)$. In this manner the local intensity profile is obtained.

The resulting profile (especially close to r=0) is found to be sensitive to the scatter of the $I(x, z_o)$ experimental date. The sensitivity is minimized by smoothing the data.

At a given axial position $z = z_o$, radial emission intensity profiles $i(r, z_o)$ are obtained for both O-atoms and Ar. Equation (7) is then applied to find the ground state O-atom concentration profile.

$$C_o(r, z_o) = qC_{Ar} \frac{i_o(r, z_o)}{i_{Ar}(r, z_o)} \quad (7)$$

Note that since Ar is not reactive, $C_{Ar}$ is independent of position.

FIGS. 3-6 illustrates experimental data as compared to ideal condition or model predictions (solid lines). The experimental data was obtained by spatially resolved optical emission spectroscopy. The experimental conditions were as follows: Pressure was 1–3 torr; power was 20–50 watts; gas flow rate was 25–100 sccm; diameter of reactive surface was 7.5–10 cm,; and frequency was 13.56 MHz.

Figure 3A:
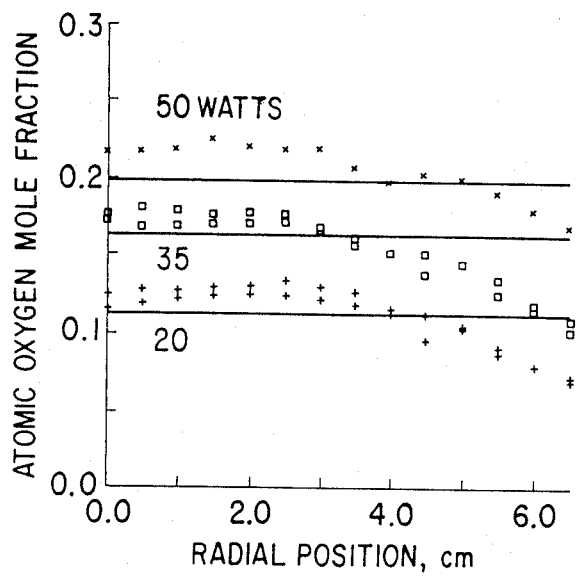
FIG. 3a is a plot of atomic oxygen mole fraction vs. radial position in an empty reactor.

FIG. 3a shows the atomic oxygen mole fraction as a function of radial position for three different values of power into the plasma. FIG. 3a is the case of an empty reactor, there is no —Ag$_2$O—film on the electrode surface. The concentration is nearly uniform close to the reactor center and decreases monotonically further away. The concentration is higher at higher power due to increased etchant production.

Figure 3B:
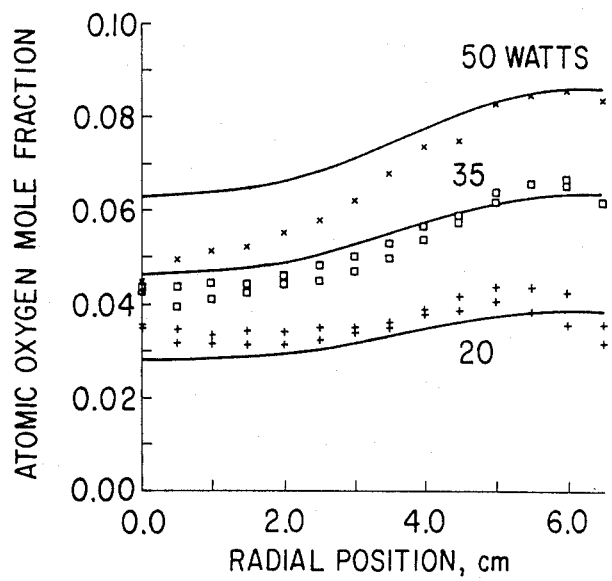
FIG. 3b is a plot of atomic oxygen mole fraction vs. radial position in a loaded reactor.

A dramatic change in the concentration profile occurs, FIG. 3b, when part of the lower electrode is coated with Ag$_2$O in the form of a concentric disk having a diameter of 75mm (loaded reactor). A "dip" in the O-atom concentration profile occurs over the reactive surface and large concentration gradients appear, especially around the boundary between active and relatively inert surfaces (for example, around 3.75 cm position). As power increases, the reactant concentration gradients become steeper. This is because at high power the reactant is produced faster that it can diffuse. Further, the reactant concentration is substantially lower in the case of a loaded reactor because of increased reactant losses.

Figure 4:
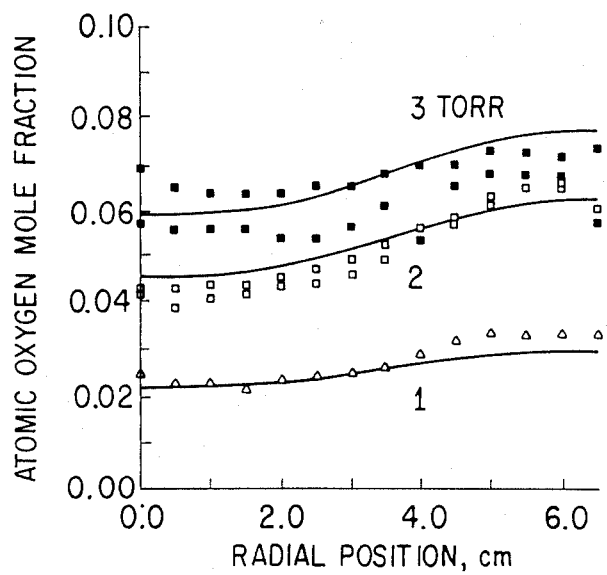
FIG. 4 is a plot of atomic oxygen mole fraction vs. radial position in a loaded reactor with a reactive film radius of 3.75 cm.

The effect of pressure is shown in FIG. 4. At lower pressure the diffusivity increases ($D \sim P^{-1}$) and concentration gradients are smaller. However, the reactant concentration decreases with decreasing pressure.

Figure 5:
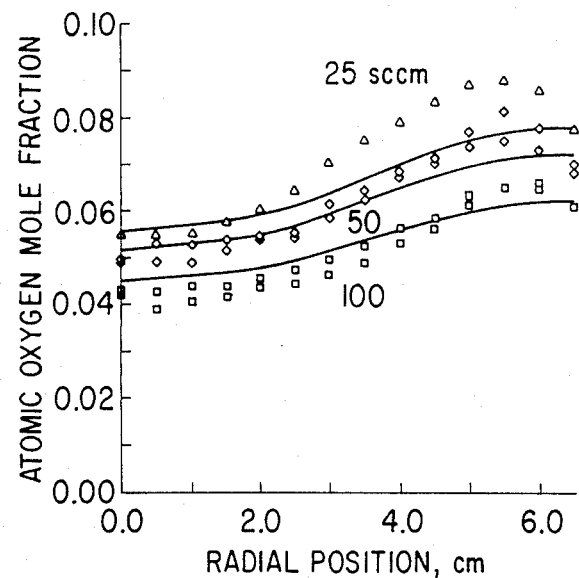
FIG. 5 is a plot as in FIG. 4, but under different conditions.
Figure 6:
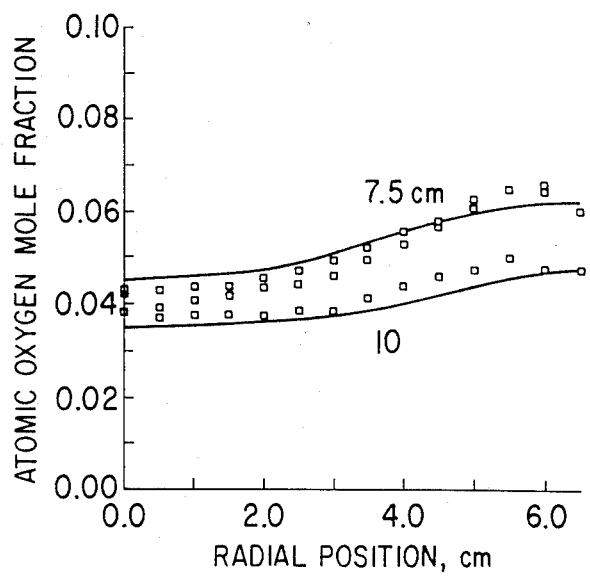
FIG. 6 is a plot of atomic mole fraction vs. radial position in a loaded reactor with two different reactive film radii.

The effect of flow rate is shown in FIG. 5. A higher flow rate results in better uniformity, but at the same time etch rate deceases. The effect of surrounding the active surface by one with similar reactivity is seen in FIG. 6, where the concentration profiles resulting from two different Ag$_2$O coating diameters are compared. The concentration profile is more uniform for larger diameter coatings, at the expense of lower reactant concentration due to increased loading.

Axial O-atom concentration gradients close to the substrate are very week in the empty reactor implying negligible surface reaction, however, large concentration gradients are observed in the loaded reactor, implying fast surface reaction.

Etching uniformity improves if the electrode surrounding the wafer is reactive against the etchant species (by surface recombination reaction). This can be implied from FIG. 6, considering the "10 cm radius" film to be a 7.5 radius film, with another 2.5 cm of identical reactivity film surrounding it. The concentration profile of the oxygen is made more uniform by this "external area of equal reactivity". This result is in contrast to the Reinberg-type radial flow reactor, where radial nonuniformities are common even if the whole substrate electrode area has the same reactivity.

Reaction selectivity may be defined as $$S = \frac{\text{Reaction rate on surface surrounding wafer}}{\text{Reaction rate on wafer surface}} \quad (8)$$

When $S<1$, a "bullseye" film clearing pattern results. When $S>1$, the inverse film clearing pattern results, i.e. etch rate decreases monotonically from the wafer center to the wafer periphery. The fact that etching is uniform when $S=1$ implies that if the plasma radius equals the wafer radius, etching is uniform. This is because there is no source of etchant species in the volume beyond the wafer radius. A method of improving etch uniformity if the plasma radius is greater than the wafer radius, is to cover the electrode area surrounding the wafer with a material having reactivity similar to that of the wafer. Such action however may result in decreased etch rate due to loading.

What is claimed:

1. A method for determining the concentration profile of the active gas species in a plasma reactor so as to allow the adjustment thereof, comprising the steps of:
    measuring the intensity of the emission of light from the plasma; and
    adjusting the concentration gradient of the active species dependent upon the measured intensity of the light emission of the plasma.

2. The method according to claim 1, wherein the surface of a semiconductor slice is being altered by etched/deposition, the measurement of the intensity of the emission of light from the plasma is of a cylinder of light from the plasma parallel to the surface of the semiconductor slice.

3. The method according to claim 2, wherein the measurement of the intensity of the emission of the light from the plasma is done with an optical train.

4. The method according to claim 3, wherein the optical train is translated in a horizontal plane to profile the emission line of light across the surface of the semiconductor slice.

5. The method according to claim 2, wherein the plasma is observed through one or more diaphragms, an optical filter, and a focus lens that directs the light into an optical fiber input of a monochrometer.

6. The method according to claim 1, including the step of introducing a gas in addition to the active gas species into the plasma reactor to serve as an actinometer.

7. The method according to claim 6, wherein light emission of the two gases are measured using a beamsplitter and two photodiodes and two optical filter corresponding to the optical emission lines of the two gases.

8. The method according to claim 6, wherein the introduced gas in addition to the active gas species is argon.

9. The method according to claim 8, wherein the actinometer is introduced in an amount of up to 6% mole fraction.

10. The method according to claim 1, wherein a small amount of inert gas is introduced into the plasma and the intensity of the light of the plasma and the intensity of the light of the inert gas are compared.

11. A method for determining and controlling the concentration profile of the active gas species in a plasma reactor comprising the steps of:
    introducing an actinometry gas into the plasma in the reactor;
    measuring the intensity of light emitted by the gas species as compared with the intensity of light emitted by the actinometry gas; and
    adjusting the concentration gradient of the active species gas dependent upon the comparison of the species gas and the actinometry gas.

12. The method according to claim 11, wherein the surface of a semiconductor slice is being altered by etch/deposition, and the measurement of the intensity of the emission of light from the plasma is of a cylinder of light from the plasma parallel to the surface of the semiconductor slice.

13. The method according to claim 12, wherein the measurement of the intensity of the emission of the light from the plasma is done with an optical train.

14. The method according to claim 13, wherein the measurement of the optical train is translated in a horizontal plane to profile the emission line of light across the surface of the semiconductor slice.

15. The method according to claim 12, wherein the plasma is observed through one or more diaphragms, an optical filter, and a focus lens that directs the light into an optical fiber input of a monochrometer.

16. The method according to claim 11, including the step of introducing argon in addition to the active gas species into the plasma reactor to serve as an actinometer.

17. The method according to claim 16, wherein light emission of the two gases are measured using a beamsplitter and two photodiodes and two optical filter corresponding to the optical emission lines of the two gases.

18. The method according to claim 11, wherein the actinometer gas is introduced in an amount of up to 6% mole fraction.

19. A method for uniformly etching or deposition across the surface of a semiconductor slice in a plasma reactor utilizing one of more specie gases comprising the steps of;
  measuring the uniformity of the concentration profile of the active species gas across the surface of the semiconductor gas; and
  adjusting the concentration of the active species gas dependent upon the measurement profile.

20. The method according to claim 19, wherein the surface of a semiconductor slice is being etched, the measurement of the intensity of the emission of light from the plasma is of a cylinder of light from the plasma parallel to the surface of the semiconductor slice.

21. The method according to claim 20, wherein the measurement of the intensity of the emission of the light from the plasma is done with an optical train.

22. The method according to claim 21, wherein the optical train is translated in a horizontal plane to profile the emission line of light across the surface of the semiconductor slice.

23. The method according to claim 20, wherein the plasma is observed through one or more diaphragms, an optical filter, and a focus lens that directs the light into an optical fiber input of a monochrometer.

24. The method according to claim 19, including the step of introducing a gas in addition to the active gas species into the plasma reactor to serve as an actinometer.

25. The method according to claim 24, wherein light emission of the two gases are measured using a beamsplitter and two photodiodes and two optical filter corresponding to the optical emission lines of the two gases.

26. The method according to claim 24, wherein the introduced gas in addition to the active gas species is argon.

27. The method according to claim 24, wherein the actinometer is introduced in an amount of up to 6% mole fraction.

28. The method according to claim 19, wherein a small amount of inert gas is introduced into the plasma and the intensity of the light of the plasma and the intensity of the light of the inert gas are compared.

29. An apparatus for determining the concentration profile of an active species across the surface of a semiconductor slice in a plasma reactor, comprising an optical system for observing the plasma emission within the plasma reactor, a monochrometer for measuring the intensity of at least one specific emission line from the plasma profiled across the surface of the semiconductor slice, and means for adjusting the concentration profile across the surface of the semiconductor slice to provide uniform etch/deposition on the surface of the semiconductor slice.

30. The apparatus according to claim 29, wherein the optical system includes one or more diaphragms, at least one filter, and a lens, for directing the plasma emission from the plasma reactor to the monochrometer.

31. The apparatus according to claim 29, wherein an actinometer gas is introduced into the reactor, and including a beamsplitter, two photodiodes and at least two filters to measure the emission lines from the active species and the actinometer gas forming the plasma in the reactor.

32. A method for determining the three dimensional concentration profile of the active gas species in a plasma reactor so as to allow the adjustment thereof, comprising the steps of:
  measuring the intensity of the emission of light from the plasma; and
  adjusting the concentration gradient of tee active species dependent upon the measured intensity of the light emission of the plasma.

* * * * *